United States Patent [19]
Holloway et al.

[11] Patent Number: 5,989,962
[45] Date of Patent: Nov. 23, 1999

[54] SEMICONDUCTOR DEVICE HAVING DUAL GATE AND METHOD OF FORMATION

[75] Inventors: Thomas C. Holloway, Murphy; Sunil V. Hattangady, McKinney, both of Tex.

[73] Assignee: Texas Instruments Incorporated, Dallas, Tex.

[21] Appl. No.: 09/159,040

[22] Filed: Sep. 23, 1998

Related U.S. Application Data

[60] Provisional application No. 60/060,121, Sep. 26, 1997.

[51] Int. Cl.$^6$ .................................................. H01L 21/8234
[52] U.S. Cl. ......................... 438/275; 438/199; 438/299; 438/770; 438/775
[58] Field of Search ..................................... 438/199, 275, 438/299, 770, 775, FOR 187, FOR 212, FOR 216, FOR 217, FOR 218

[56] References Cited

U.S. PATENT DOCUMENTS

| | | | |
|---|---|---|---|
| 4,151,006 | 4/1979 | De Graaff et al. | 148/1.5 |
| 5,254,489 | 10/1993 | Nakata | 437/40 |
| 5,327,002 | 7/1994 | Motoyoshi | 257/380 |
| 5,497,021 | 3/1996 | Tada | 257/369 |
| 5,502,009 | 3/1996 | Lin | 437/239 |
| 5,576,226 | 11/1996 | Hwang | 437/24 |
| 5,716,863 | 2/1998 | Arai | 437/41 |
| 5,763,922 | 6/1998 | Chau | 257/371 |

*Primary Examiner*—Wael M. Fahmy
*Assistant Examiner*—Long Pham
*Attorney, Agent, or Firm*—Jacqueline J. Garner; Wade James Brady; Richard L. Donaldson

[57] ABSTRACT

The invention comprises a method of forming a semiconductor device is provided where a first gate insulator layer 26 is formed on an outer surface of semiconductor substrate 24. A mask body 28 is formed to cover portions of the insulator layer 26. The exposed portions of the layer 26 are subjected to a nitridation process to form a nitride layer 30. A second oxidation process forms a thick gate oxide layer 32. The nitride layer 30 inhibits the growth of oxide resulting in a single integrated device having gate insulator layers having two different thicknesses such that high voltage and low voltage transistors can be formed on the same integrated circuit.

12 Claims, 1 Drawing Sheet

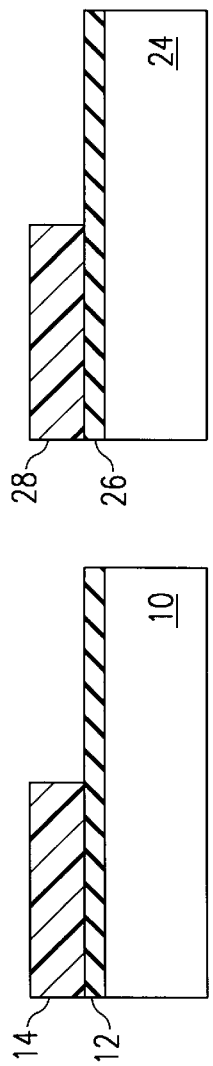
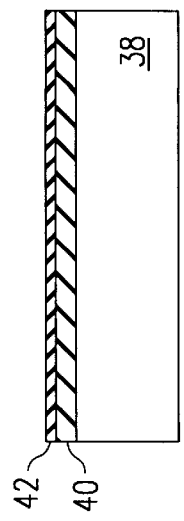
FIG. 1a
FIG. 1b
FIG. 1c
FIG. 1d
FIG. 2a
FIG. 2b
FIG. 2c
FIG. 2d
FIG. 3a
FIG. 3b
FIG. 3c
FIG. 3d

5,989,962

SEMICONDUCTOR DEVICE HAVING DUAL GATE AND METHOD OF FORMATION

This application claims priority under 35 USC § 119 (e) (1) of provisional application Ser. No. 60/060,121, filed Sep. 26, 1997.

TECHNICAL FIELD OF THE INVENTION

This invention relates generally to the field of electronic devices and more particularly, to an improved semiconductor device comprising gates of separate transistors that are capable of interfacing with different supply voltages and a method of forming the same.

BACKGROUND OF THE INVENTION

As semiconductor processing technologies improve, device geometries of integrated circuits are continually made smaller so that the device density of the entire system can be maximized. This results in MOS transistors within integrated devices having shorter and shorter gate lengths which results in the necessity of a reduction in gate oxide thickness and operating supply voltage in order to support the minimum gate length without excessively high threshold voltages. The minimum allowable gate oxide thickness for a given device is limited by the time dependent dielectric breakdown of the thin oxide at the desired operating voltage. As a result, the operating voltages applied to the gates of MOS transistors within a particular device must be reduced as the gate oxides within these devices are reduced in thickness.

It is often the case that devices of one generation need to communicate with devices of prior generations of integrated systems. For example, a device having a given device geometry and gate oxide thickness may need to have input/output devices constructed on the same semiconductor substrate that have thicker gate oxides to enable the high performance device to communicate at the same voltage levels as surrounding integrated circuits that are operating using prior generations of device geometries and gate voltages. In this manner, a chip having a channel length of 0.25 microns and a corresponding gate voltage of 1.8 volts may also need to have constructed on the same chip transistors having 0.6 micron channels able to operate at 3.3 volts. In this particular example, the high performance devices may have a gate oxide on the order of 40 Angstroms in thickness where the higher voltage input/output devices will have a gate oxide on the order of 80 Angstroms in thickness.

The formation of gate oxide layers having two different thicknesses on the same substrate is very problematic. In order to form these transistors, the gate oxides must be patterned using photolithographic techniques. Using conventional techniques, it is often the case that if two gate oxide thicknesses are needed there will be an occasion for a photoresist mask to be in place proximate to bare semiconductor substrate. This situation can result in the degradation of the surface of the substrate especially in the area intended to be used for high performance transistors.

Accordingly, a need has arisen for a method of forming a semiconductor device having two different gate oxide thicknesses that will not degrade the performance of the high performance transistors within the integrated device.

SUMMARY OF THE INVENTION

In accordance with the teachings of the present invention, a semiconductor device and a method of forming the same are provided that substantially reduce or eliminate disadvantages and problems associated with prior methods and devices.

According to one embodiment of the present invention, a method of forming a semiconductor device is provided that comprises the steps of forming a first gate insulator layer. The outer surface of the gate insulator layer is then masked such that only the portions of the gate insulator layer to be used for low voltage devices are exposed. The exposed portion of the gate insulator layer is then processed to create a nitride layer. The masking material is then removed. Additional gate insulator layer is then grown to increase the thickness of the dielectric of the portion of the insulator layer associated with high voltage devices. The nitride layer is operable to prevent the further growth of the dielectric in the area of the insulator layer to be used for low voltage devices.

BRIEF DESCRIPTION OF THE DRAWINGS

A more complete understanding of the present invention may be acquired by referring to the accompanying figures in which like reference numbers indicate like features and wherein:

FIGS. 1A–1D are greatly enlarged, elevational, cross-sectional diagrams showing problems associated with the formation of devices having different gate insulator thicknesses;

FIGS. 2A–2D are greatly enlarged, elevational, cross-sectional diagrams showing the method of forming a semiconductor device having devices having gate insulator layers of different thicknesses according to the teachings of the present invention; and FIGS. 3A–3D are greatly enlarged cross-sectional elevational diagrams showing an alternate method of practicing the present invention.

DETAILED DESCRIPTION OF THE INVENTION

FIGS. 1A–1D are a series of diagrams which help to illustrate problems associated with the formation of gate insulator layers having different thicknesses on the same integrated device. Referring to FIG. 1A, a semiconductor substrate 10 has a first gate insulator layer 12 disposed on an outer surface. Gate insulator layer 12 may comprise a suitable dielectric material such as silicon dioxide and may be on the order of 40 Angstroms in thickness. A mask layer 14 has been deposited and developed using photolithographic techniques such that it covers a portion of the outer surface of gate insulator layer 12. Mask layer 14 may comprise for example, photoresist. The portion of the device covered by mask layer 14 will be used to form high voltage input/output transistors which require a thicker gate oxide. The portion of the gate insulator 12 that is not covered by mask layer 14 in FIG. 1A will be used to form high-performance, low-voltage transistors that require a thinner gate insulator layer.

Referring to FIG. 1B, the problem associated with the formation of dual thickness gate oxide layers becomes apparent. An etch step has been used to expose a portion indicated at 16 of the outer portion of substrate 10. The etch process used to expose surface 16 is problematic. Surface 16 is intended to eventually form the outer surface of the channel of high performance MOS transistors. As such, it is undesirable to use a plasma etch process to remove the portions of layer 12 covering surface 16. The plasma bombardment can create damage to the crystalline matrix in surface 16 which could negatively affect the mobility of carriers within the substrate 10 near surface 16. As such, a conventional wet etch process must be used. However, the wet etch process is very difficult to control especially in very small device geometries. Wet etch processes are typically isotropic and as such will undercut the mask layer 14. If this undercut is excessive the process may result in the inadvertent removal of the mask layer 14 which destroys the device. In addition, it is undesirable to have exposed portions of the substrate proximate to photoresist because of the possibility that impurities within the photoresist and, especially, metallic contamination can result to the exposed semiconductor substrate. This sort of contamination can greatly affect the eventual integrity of the gate oxide to be formed on surface 16. Once again, this contamination can result in degradation to the performance of the low voltage transistors to be formed proximate surface 16.

FIG. 1C illustrates the growth of the thin second gate insulator layer 18 which also results in the thickening of the first gate insulator layer 12. Finally, FIGURE 1D illustrates the formation of gate conductor bodies 20 and 22 disposed outwardly from gate insulator layer 12 and 18, respectively. Using the techniques described with reference to FIG. 1B, it is difficult to create high performance MOS transistors because of the dangers of contamination and the difficulties in patterning the fine geometries required.

FIGS. 2A–2D illustrate a series of process steps which result in the formation of both high voltage and low voltage transistors without the problems described with reference to FIGS. 1A–1D. Referring to FIG. 2A, the semiconductor substrate 24 has a first gate insulator layer 26 formed on an outer surface. A mask body 28 covers a portion of the outer surface of gate insulator layer 26. Semiconductor substrate 24 may comprise a suitable semiconductor material such as silicon. Gate insulator layer 26 may comprise a suitable dielectric material such as silicon dioxide. Mask body 28 may comprise photoresist.

Referring to FIG. 2B, a nitride layer 30 is formed outwardly from the exposed portions of gate insulator layer 26. The mask body 28 prevents the nitridation of the portions of gate insulator layer 26 covered by mask body 28. Nitride layer 30 may be formed by exposing the outer surface of gate insulator layer 26 to a plasma nitridation process using a nitrogen plasma at a power of 2,000 Watts for a duration of 60 seconds.

Referring to FIG. 2C, mask body 28 is removed and the structure is subjected to a second oxidation process. This oxidation process results in the thickening of the portion of insulator layer 26 that was disposed inwardly from mask body 28 to form a thick oxide layer 32. According to one embodiment of the present invention, the thin gate insulator layer 26 is on the order of 40 Angstroms in thickness. According to this embodiment, the thick gate insulator layer 32 is on the order of 80 Angstroms in thickness. These gate oxide thicknesses allow for the formation of high performance MOS transistors having 0.25 microns channel lengths and operating at 1.8 volts of gate voltage in the areas associated with gate insulator layer 26. In the areas associated with gate insulator layer 32, the transistors may have channel lengths on the order of 0.6 microns and operate at a gate voltage on the order of 3.3 volts. Referring to FIG. 2D, the transistors are completed with the formation of gate conductor bodies 34 and 36 associated with gate insulator layer 26 and gate insulator layer 32, respectively.

As such, the use of a conventional photoresist mask layer to expose a portion of the gate insulator layer to nitridation allows for the continued oxidation of only a portion of the gate insulator layer. The nitride layer formed outwardly from the thin gate insulator layer inhibits the growth of oxide in the these regions. Accordingly, a thick gate oxide layer associated with high voltage devices and a thin gate oxide layer associated with low voltage high performance devices can be formed on the same device without having photoresist material proximate to exposed semiconductor substrate material.

FIGS. 3A–3D illustrate an alternate method of practicing the present invention. FIG. 3A illustrates a semiconductor substrate 38 which has a first gate insulator layer 40 disposed on an outer surface. A nitride layer 42 is formed outwardly from gate insulator layer 40. Substrate 38 may comprise a suitable semiconductor material such as silicon. Gate insulator layer 40 may comprise a suitable dielectric material such as silicon dioxide on the order of 40 angstroms in thickness. Nitride layer 42 may be formed using the same process as described to form nitride layer 30 with reference to FIG. 2B previously. Referring to FIG. 3B, a mask body 44 is formed using conventional photo lithographic processes such that it covers the portions of gate insulator layer 40 and nitride layer 42 to be used for the low voltage high performance transistors. A wet etch or plasma etch process can be then be used to expose a portion 46 of the outer surface of substrate 38. Surface 46 will be used to form the high voltage input/output transistors of the integrated device.

Referring to FIG. 3C the mask body 44 is removed and the structure is subjected to a second oxidation process which results in the formation of a thick gate oxide layer 48 outwardly from surface 46. Gate oxide layer 48 may comprise silicon dioxide and is on the order of 80 Angstroms in thickness.

Finally, in FIG. 3D the transistor devices are further completed with the formation of a gate conductor body 50 disposed outwardly from gate insulator layer 48 and a gate conductor body 52 disposed outwardly from nitride layer 42 and gate insulator layer 40.

Although FIG. 3B illustrates a point in the process where bare semiconductor substrate is exposed to contamination from mask body 44, this is not as problematic as the processes which were described with reference to FIG. 1. This is due to the fact that the exposed portion of the substrate 38 is only intended to be used for high voltage input/output transistors as opposed to the smaller geometry low voltage devices which are used to form the bulk of the active devices within an integrated system. Input/output devices are typically not as numerous and the geometry used to form the input/output devices are not as fine and, as such, impurities and other irregularities within the channels of these devices are not as critical.

The method illustrated with reference to FIGS. 2A–2D and FIGS. 3A–3D result in the nitridation of the outer surface of the gate insulator layer used for the low voltage high performance transistors. This nitride layer also acts as a diffusion barrier to prevent the migration of impurities that might degrade the performance of the device. In addition, the nitridation of the gate insulator layer can have the effect of reducing the effective thickness of the gate oxide which can once again be helpful in the design and performance of the low voltage devices. Additional processes may be used to form a nitride layer outwardly from the thicker gate oxides if necessary to improve the performance of the high voltage devices or if the need for diffusion barrier in the high voltage devices presented itself.

The figures illustrate the high voltage and low voltage devices immediately next to one another on the substrates shown. It should be understood that this is solely for purposes of teaching the present invention. In fact, the devices would rarely, if ever, be immediately proximate one another. However, the problems of impurities and the processing steps used to form the layers described herein are accurate and applicable to the situation where the gate oxide differing thicknesses are separated on a single integrated circuit chip.

Although the present invention has been described in detail it should be understood the various changes alterations, substitutions and modifications may be made to the teachings described herein without departing from the spirit and scope of the present invention which is solely defined by the dependent claims.

What is claimed is:

1. A method of forming a semiconductor device comprising the steps of:

forming a first gate insulator layer outwardly from a surface of a semiconductor substrate;

masking a first portion of an outer surface of the gate insulator layer such that only a second portion of the gate insulator layer is exposed, wherein the second portion of the gate insulator layer is used for low voltage devices;

forming a nitride layer outwardly from the second portion of the gate insulator layer; and forming an additional gate insulator layer over the first portion of said gate insulator layer to increase a thickness of the first portion of the insulator layer associated with high voltage devices, the nitride layer operable to prevent the further growth of the insulator layer in the second portion of the insulator layer.

2. The method of claim 1 and further comprising the step of removing the layer used to mask the portion of the outer surface of the gate insulator layer.

3. The method of claim 1, wherein the gate insulator layer comprises silicon dioxide.

4. The method of claim 1, wherein the step of masking uses a masking layer that comprises photoresist.

5. The method of claim 1, wherein the nitride layer comprises silicon nitride.

6. The method of claim 1, wherein the thickness of the insulator layer associated with the high voltage devices is about twice the thickness of the insulator layer associated with the low voltage devices.

7. The method of claim 1, wherein the step of forming a nitride layer comprises the step of exposing the outer surface of the first insulator layer to a nitrogen plasma having a power of about 2,000 watts for a duration of about 60 seconds.

8. A method of forming an integrated circuit, comprising the steps of:

forming a gate insulator over a semiconductor body;

forming a masking layer over a first portion of said gate insulator, said masking layer exposing a second portion of said gate insulator;

forming a nitride layer over the second portion of the gate insulator;

removing said masking layer; and subjecting said first portion of said gate insulator to an oxidation step to increase a thickness of said first portion.

9. The method of claim 8, wherein said gate insulator comprises silicon dioxide.

10. The method of claim 8, wherein the thickness of said first portion is approximately twice a thickness of said second portion after said subjecting step.

11. The method of claim 8, wherein the step of forming a nitride layer comprises the step of exposing a surface of the second portion of the gate insulator to a nitrogen plasma having a power of about 2,000 watts for a duration of about 60 seconds.

12. The method of claim 8, further comprising the step of:

forming a first gate conductor body over said first portion of said gate insulator and a second gate conductor body over said nitride layer.

* * * * *